(12) United States Patent
Melanson

(10) Patent No.: US 7,535,396 B1
(45) Date of Patent: May 19, 2009

(54) DIGITAL-TO-ANALOG CONVERTER (DAC) HAVING FILTER SECTIONS WITH DIFFERING POLARITY

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 12/052,725

(22) Filed: Mar. 20, 2008

(51) Int. Cl.
H03M 1/66 (2006.01)

(52) U.S. Cl. ...................... 341/144; 341/145

(58) Field of Classification Search ............... 341/144, 341/145, 150, 143
See application file for complete search history.

(56) References Cited

U.S. PATENT DOCUMENTS

| | | | |
|---|---|---|---|
| 5,164,725 A | 11/1992 | Long | |
| 6,727,832 B1 | 4/2004 | Melanson | |
| 6,885,330 B2 | 4/2005 | Trotter et al. | |
| 6,967,607 B2 | 11/2005 | Melanson | |
| 7,277,035 B1 * | 10/2007 | You et al. | 341/144 |

* cited by examiner

Primary Examiner—Rexford Barnie
Assistant Examiner—Joseph Lauture
(74) Attorney, Agent, or Firm—Andrew M. Harris; Mitch Harris, Atty at Law, LLC

(57) ABSTRACT

A digital-to-analog converter (DAC) having filter sections with differing polarity provides a low-noise, low area bipolar output solution in delta-sigma modulator based DACs. A shift register receives an input bit-stream and provides a series of tap outputs that are used to control application of a number of current sources to output summing nodes. The current sources are divided into mutually-exclusive sets of positive polarity and negative polarity current sources, which are not necessarily contiguous. In one embodiment, half of one of the sets of current sources precedes the other set of current sources, and the other half of the divided set of current sources provides the final set of output taps. The number of current sources in each set may be equal, so that the midpoint of the output corresponds to zero current.

20 Claims, 4 Drawing Sheets

DIGITAL-TO-ANALOG CONVERTER (DAC) HAVING FILTER SECTIONS WITH DIFFERING POLARITY

BACKGROUND OF THE INVENTION

1. Field of the Invention

The present invention relates generally to digital-to-analog converters (DACs), and more specifically, to a DAC having filter sections that differ in polarity.

2. Background of the Invention

DAC circuits implemented using a finite impulse response (FIR) filter are used widely in delta-sigma modulator based DAC integrated circuits. Conversion of a digital value to an analog signal is accomplished by serially clocking a bitstream output of the delta-sigma modulator through a shift register that controls a number of current sources. The current sources are summed to provide an analog output, which is typically converted either internally or externally to a voltage representing the digital value. The filtering action is provided by the summation of the individual currents which act as equal-weighted taps of the filter, and provides a low-pass characteristic determined by the length of the filter which removes quantization noise that is aliased above the Nyquist frequency of the converter.

DAC outputs, particularly those used as audio signal sources, frequently require a bi-polar output characteristic, in which the full range of the output is substantially centered around a zero-voltage or zero-current level. The extremes of the output extend from a positive full-scale value to a negative full-scale value. The DACs output may be a current output that mirrors the current outputs generated by the DAC elements, or a single-ended or differential voltage output generated by a trans-resistance stage that converts the current to a voltage. In one typical switched-current FIR filter output configuration, a bipolar output is provided by summing the current sources selected by the filter taps, which are of a single polarity. The resulting sum is then combined with a fixed current of opposite polarity that is substantially equal to half of the maximum selectable tap current, in order to set the midpoint of the output near zero current. The fixed current source adds noise to the output without contributing any signal margin. Also, the capacitance of the DAC current output varies with the value being converted. Further, each pair of current sources must be well-matched, as well as the matching typically required among the individual taps.

In another typical switched-current FIR filter output configuration, two current summing nodes are provided and current sources of both polarities are selected to one of the two summing nodes according to the bit value at the corresponding tap. The signal-to-noise performance is improved over the above-described configuration, and the output capacitance is held substantially constant. However, additional circuit area and power are required to provide pairs of current sources for each tap.

Finally, an offset can be provided in the output amplifier of a DAC to bias the uni-polar current output to form a bi-polar output. However, such schemes are typically undesirable, as variation in the offset from device to device and over temperature is difficult to control and may require large circuit area and power to provide a stable offset current or voltage reference.

Therefore, it would be desirable to provide a DAC having a bipolar output with reduced noise that does not require additional circuit area and power, nor having increased matching requirements over a DAC having a uni-polar output.

SUMMARY OF THE INVENTION

The above stated objectives, as well as others, are achieved in a digital-to-analog converter (DAC) circuit and its method of operation.

The DAC circuit includes a digital filter having a switched current output provided by a shift register that receives a digital input bit-stream and provides a series of tap outputs that operate switches controlling the application of current sources to DAC output summing nodes. The current sources are divided into a set of positive polarity current sources and a set of negative polarity current sources. The taps controlling the positive polarity current sources and the taps controlling the negative polarity current sources are mutually exclusive, so that each tap controls only a positive or a negative current source. The number of current sources in each set may be equal, so that the midpoint of the current output levels corresponds to zero current. The sets are also not necessarily contiguous, for example, one of the sets may be divided in half with half of the taps corresponding to the divided set preceding the entire set of taps corresponding to the other set, with the other half of the divided set providing the final set of taps.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention relates to a finite impulse response (FIR) switched digital-to-analog converter (DAC) circuit and method for providing a bipolar DAC output. Rather than offsetting the output of the DAC, providing an offset current source to shift a uni-polar current to provide the bipolar output, or providing pairs of current source of each polarity, the DAC of the present invention divides the FIR filter into stages and assigns different polarity current sources to the different stages. By dividing the FIR filter into different polarity stages, a bipolar current filter output current can be achieved without increasing the number of current sources and switching elements required to implement the taps.

Figure 1A:
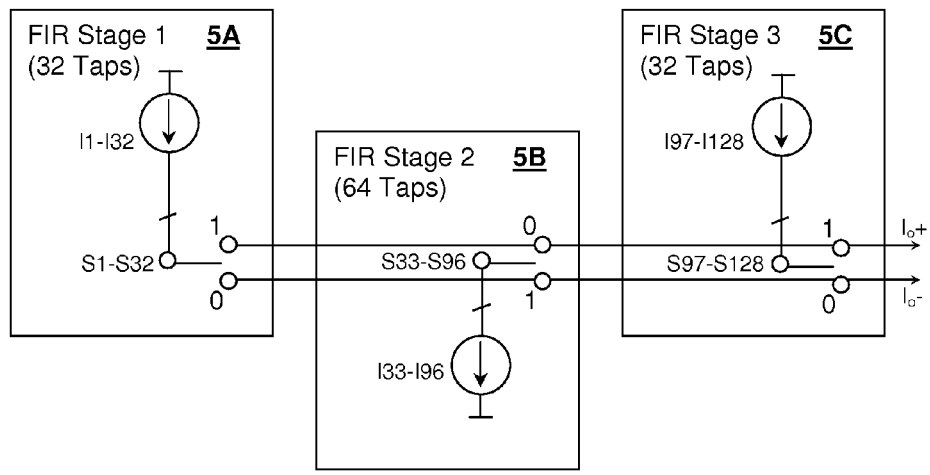
FIG. 1A is a simplified schematic diagram depicting a set of switched-current FIR filter stages in accordance with an embodiment of the present invention.

Referring now to FIG. 1A, a simplified schematic diagram of a switched-current FIR filter stage in accordance with an embodiment of the present invention is shown. The exemplary FIR filter includes three filter stages 5A, 5B and 5C that provide currents to two current summing node outputs $I_o+$ and $I_o-$. In each FIR filter stage 5A-5C, a number of current sources equal to the number of taps is included: current sources I1-I32 in FIR filter stage 5A, which respectively correspond to taps 1-32, current sources I33-I96 in FIR filter stage 5B, which respectively correspond to taps 33-96 and current sources I97-I128 in FIR filter stage 5C, which respectively correspond to taps 97-128. Each FIR filter stage 5A-5C, also includes a set of switches, each corresponding to one of current sources I1-I128: switches S1-S32 in FIR filter stage 5A, switches S33-S96 in FIR filter stage 5B, and switches S97-S128 in FIR filter stage 5C. Switches S1-S128 apply the output of each of corresponding current sources I1-I128 to one of current summing node outputs $I_o+$ and $I_o-$, according to binary tap values of the FIR filter.

FIR stage 15B differs from FIR stages 15A and 15C in that the polarity of current sources I33-I96 is opposite the polarity of current sources I1-I32 and I97-I128. In order to preserve the desired filter response, the relationship between the control input to switches S33-S96, i.e., the corresponding binary tap value, and the selected one of current summing node outputs $I_o+$ and $I_o-$, is also reversed. Therefore, the filter response of the FIR filter of FIG. 1A matches that of a traditional 128-tap boxcar FIR filter. However, the differential output current range extends from 64 times the individual current source magnitudes at each of current summing node outputs $I_o+$ and $I_o-$ in each polarity, and the midpoint of the differential current between summing node outputs $I_o+$ and $I_o-$ is zero.

Figure 1B:
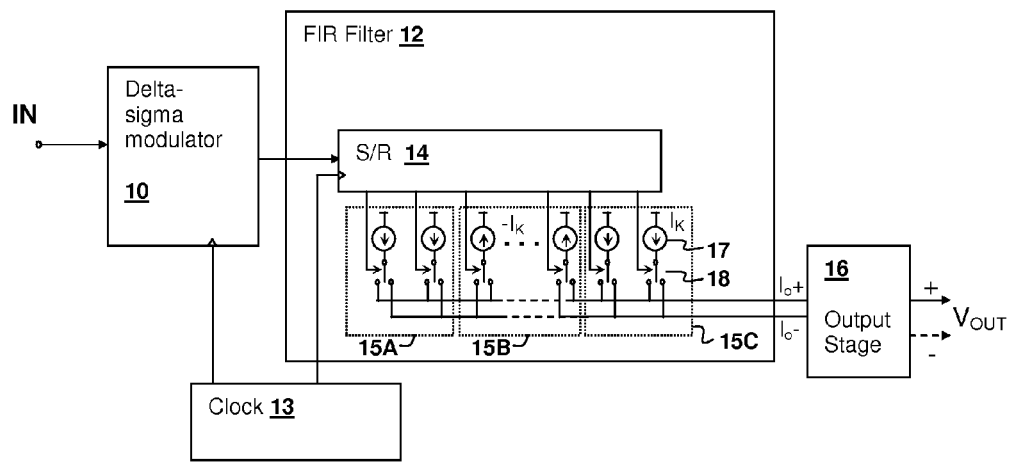
FIG. 1B is a schematic diagram depicting a digital-to-analog converter (DAC) in accordance with an embodiment of the present invention.

Referring now to FIG. 1B, a digital-to-analog converter (DAC) in accordance with an embodiment of the present invention is shown. A digital input is supplied to a delta-sigma modulator 10 operated by a sampling clock 13 that provides an input to a finite impulse response (FIR) filter 12. FIR filter 12 may be one of multiple parallel filters used to implement a DAC for improved matching, or may implement a single filter. The output of FIR filter 12 is provided to an output stage 16 that converts the differential current provided by a set of tap current sources 17 into a voltage output. Alternatively, output stage 16 may be a current mirror or current amplifier if a current output is required. Each tap constant current 17 has a corresponding switching element 18 that applies the current source output to one of two current summing node outputs $I_o+$ and $I_o-$, which are provided as inputs to output stage 16. The summing node $I_o+$, $I_o-$ to which each current source provides current is selected by the binary value of a corresponding output of a shift register 14 that receives the output of delta-sigma modulator 10.

The magnitude $I_K$ of each current source 17 in FIR filter 12 is equal, forming a boxcar filter, but the polarity of the current sources are not the same for each current source 17, which are arranged in the same manner as illustrated in the FIR filter of FIG. 1A. In the exemplary embodiment, current sources 17 and corresponding switches 18 are organized into sections 15A, 15B and 15C, with the polarity of the current sources 17 in section 15B being opposite that of the polarity of current sources 17 in sections 15A, 15B and 15C. Also, in the exemplary embodiment, the number of current sources in section 15B, e.g., 64, is twice the total number of current sources in sections 15A and 15C, e.g. 32 each, so that the midpoint of the selectable output current is zero. The current summing node to which the switches 18 of taps in section 15B apply current for a given binary tap state is reversed with respect to taps in sections 15A and 15C, so that the transfer function of FIR filter 12 is not altered from that of an ordinary boxcar filter.

Figure 2A:
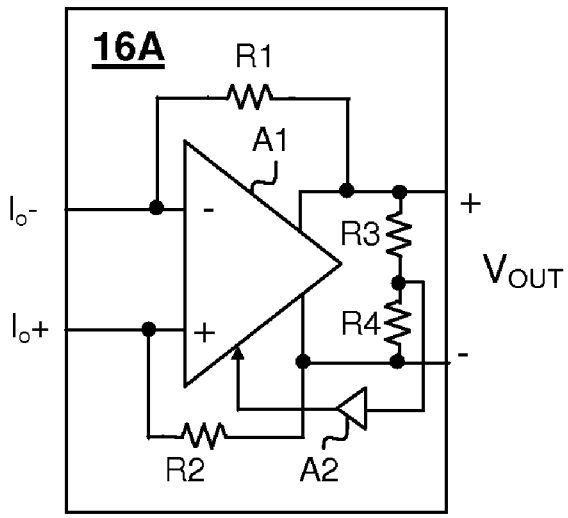
FIGS. 2A-2F are schematic diagrams depicting output stage configurations in accordance with various embodiments of the present invention that may be used in the circuit of FIG. 1B.

Referring now to FIG. 2A, an exemplary output stage 16A that may be used to implement output stage 16 of the DAC of FIG. 1B is shown. Output stage 16A is formed by an operational amplifier A1, configured as a transresistance stage by feedback resistors R1 and R2, which provides currents to cancel the input currents. Common-mode voltage nulling is provided by a feedback network formed by resistors R3 and R4, along with amplifier A2. The depicted circuit has good noise rejection. However, if only a single output is used (i.e., a difference in load impedance at the outputs exists), then the common-mode voltage loop will be disturbed, resulting in an offset and possible noise increase, since the symmetry of the voltage division provided by resistors R3 and R4 is altered by the difference in load impedance. Therefore, other output stage embodiments having outputs that are not disrupted by a single-ended load impedance are described below with reference to other Figures.

Figure 2B:
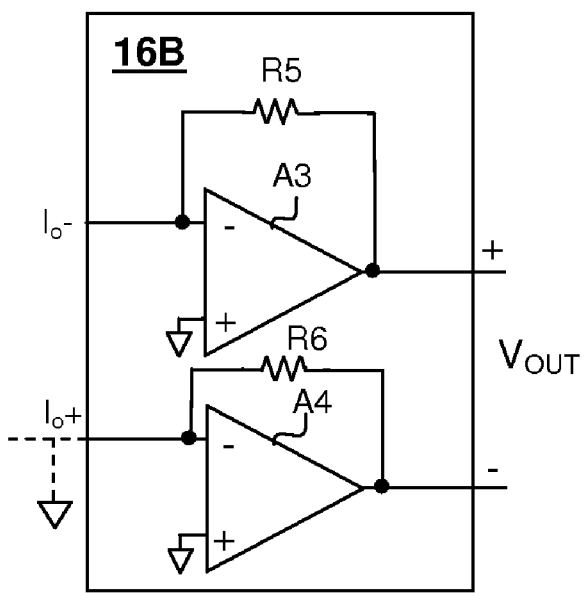

Referring now to FIG. 2B, another exemplary output stage 16B that may be used to implement output stage 16 of the DAC of FIG. 1B is shown. Output stage 16B is formed by a pair of operational amplifiers A3 and A4, configured as individual transresistance amplifiers by feedback resistors R5 and R6. A single-ended implementation can be provided by connecting the second current input to a reference (e.g., ground) and omitting the second single-ended stage formed by amplifier A4 and resistor R6. The depicted circuit provides a good compromise for providing use of the outputs in single-ended and differential connections/loading, but gives up noise performance due to the lack of true differential operation using a single differential amplifier.

Figure 2C:
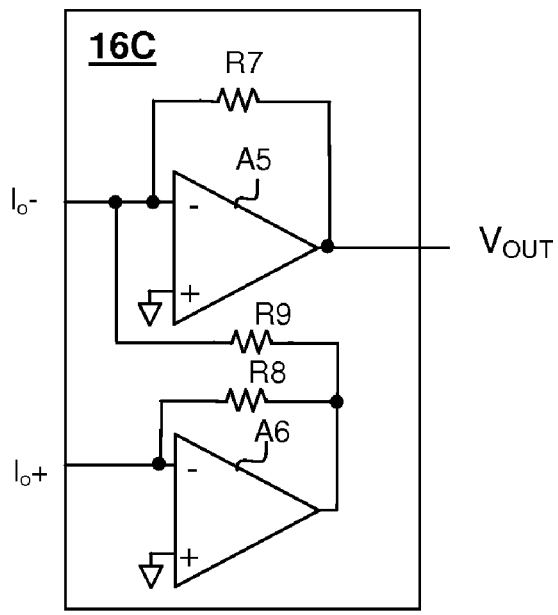

Referring now to FIG. 2C, yet another exemplary output stage 16C that may be used to implement output stage 16 of the DAC of FIG. 1B is shown. Output stage 16C is a single-ended output stage formed by a pair of operational amplifiers A5 and A6, configured as individual transresistance amplifiers by feedback resistors R7 and R8. Resistor R9 provides feedback that cancels differential offset and noise that would otherwise be present on single-ended output voltage $V_{OUT}$ if, for example, the non-inverting output of output stage 16B of FIG. 2B were used as a single-ended output. The resistance of resistors R9 and R8 is double that of resistor R7, so that the gain through amplifier A6 is raised to match the additional signal present through amplifier A5 due to the current from the current output of the DAC combining with the current provided through resistor R9.

Figure 2D:
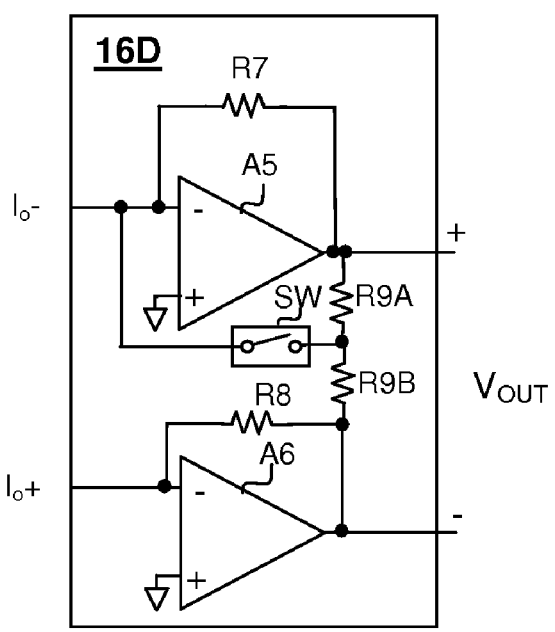

Referring now to FIG. 2D, yet another exemplary output stage 16D that may be used to implement output stage 16 of the DAC of FIG. 1B is shown. Output stage 16D provides selectable single-ended or differential operation via a switch SW which is included to disable the feedback path through the feedback resistance path provided by resistors R9A and R9B, which have a total resistance equal to that of resistor R9 in output state 16C FIG. 2C. When switch SW is closed, output stage 16D is similar to output stage 16C of FIG. 2C, except that resistors R9A and R9B attenuate the feedback provided through switch SW. Resistor R8 and resistor R7 are equal in value, so that when switch SW is open, output stage 16D is identical to output stage 16B of FIG. 2B, with the exception of an inconsequential difference in output loading due to resistors R9A and R9B. Resistors R9A and R9B are each equal in value to resistors R8 and R7, so that when switch SW is closed, the midpoint of the offset (and any common-mode noise) at the outputs of amplifiers A5 and A6 is produced by the voltage divider implemented by resistors R8 and R7 and has a transresistance gain of one-half with respect to input current $I_O-$ at the input of amplifier A5, which effectively cancels the offset and common-mode noise. For example, if resistors R7, R8 and R9A-R9B have a resistance R, then the output voltage of amplifier A5 will be: $V_{OUT}+=-(RI_O-)-2R[(V_{OUT}++V_{OUT}-)/2R]=-(RI_O-)-(V_{OUT}++(RI_O+))$ and therefore $V_{OUT}+=-((RI_O+)-(RI_O-))/2$, which removes the common mode and has a gain equal to the single-ended mode configuration with switch SW open.

In each of the above-described embodiments, the differential amplifiers may be chopper amplifiers that reduce the effect of 1/f (flicker) noise on the signal by modulating the current output of FIR filter 12 to a frequency band sufficiently above the flicker noise corner and demodulating the signal after amplification.

Figure 2E:
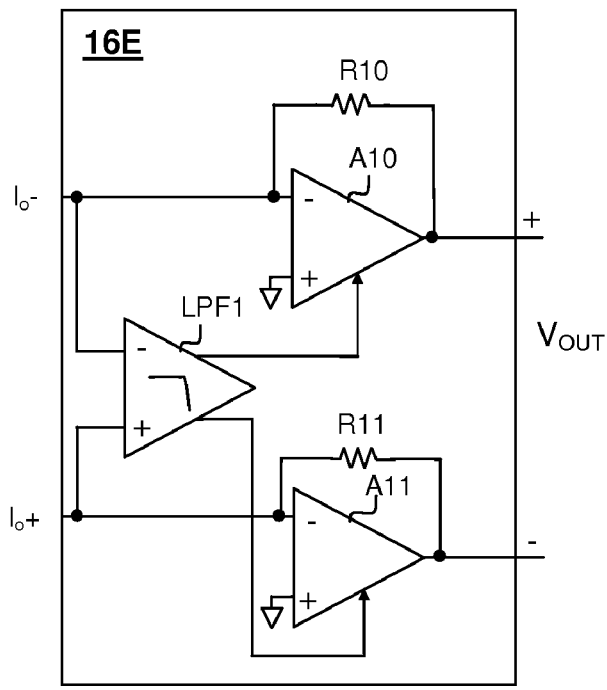

Referring now to FIG. 2E, another exemplary output stage 16E that may be used to implement output stage 16 of the DAC of FIG. 1B is shown. Output stage 16E is similar to output stage 16B of FIG. 2B, except that a low-pass filter LPF1 is included to remove low frequency noise (e.g., flicker noise) generated by amplifiers A10 and A11, and appearing on their input summing nodes. Low-pass filter LPF1 is illustrated as a fully-differential stage and has inputs coupled to the input summing nodes of amplifiers A10 and A11. Since amplifiers A10 and A11 are configured as transresistance stages and the input sources are high-impedance (constant current sources), noise generated by amplifiers A10, A11 and coupled through resistors R10 and R11 is not canceled nor substantially attenuated at the corresponding input summing nodes of amplifiers A10 and A11. Therefore, low-pass filter LPF1 is responsive to any differential offset and noise, including noise generated by amplifers A10 and A11, and generates outputs which are provided to cancelation inputs of amplifiers A10 and A11, so that differential offset and noise appearing between the summing node inputs to amplifiers A10 and A11 are removed from differential output $V_{OUT}$. Low-pass filter LPF1 is designed with low gain and high input impedance so that the summing node currents are not disrupted and to provide a stable cancelation loop.

In the circuit of FIG. 2E, low-pass filter LPF1 will generally be implemented as a chopper amplifier, but amplifiers A10 and A11 are not chopped, so that any noise generated by low-pass filter LPF1 is removed by the chopping action and then the low frequency output of low-pass filter LPF1 is used to cancel the noise generated by amplifiers A10 and A11, rather than using a chopper to modulate the signal out of the flicker noise frequency range.

Figure 2F:
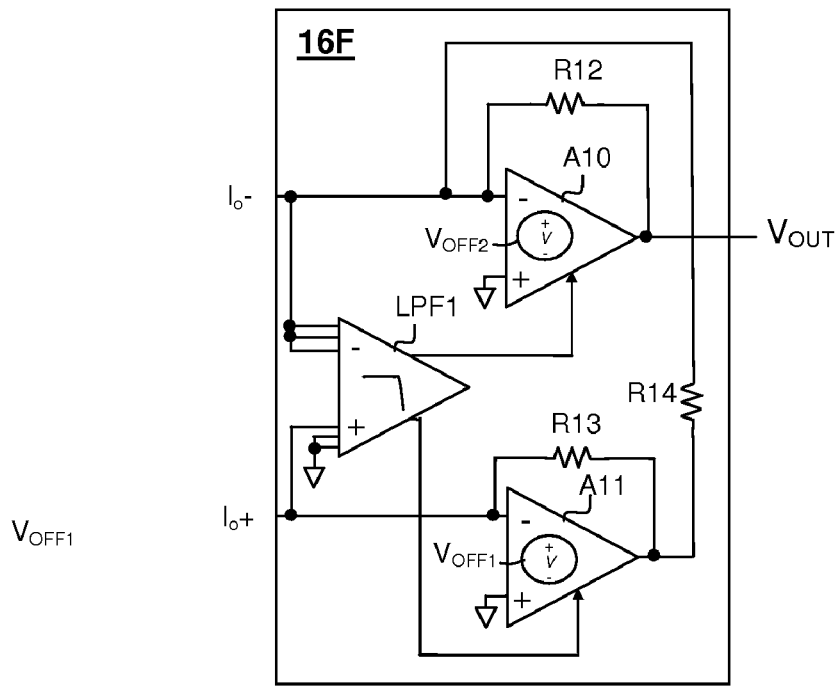

Referring now to FIG. 2F, another exemplary single-ended output stage 16F that may be used to implement output stage 16 of the DAC of FIG. 1B is shown. Output stage 16F is similar to output stage 16E of FIG. 2E, but also includes the feedback arrangement present in the circuits of FIG. 2C and FIG. 2D (when switch SW is closed) to provide a single-ended output that removes common-mode offset and noise. The feedback signal may also be made selectable as shown in FIG. 2D, for optimizing single-ended performance. Output stage 16F includes feedback resistor R14 which has a resistance twice that of resistor R12. Resistor R13 also has a resistance twice that of resistor R12, so that the gain of the stage including amplifier A11 is set at twice that of the stage including amplifier A10. Assuming that resistor R12 as a resistance R, resistors R13 and R14 therefore have a resistance 2R, and the gain at $V_{OUT}$ with respect to the output of amplifier A11 is half of the gain at $V_{OUT}$ with respect to input $I_O-$. (Since twice the offset voltage at the output of A11 must be generated to generate the same current at the input of amplifier A10 as an offset voltage at the output of amplifier A10.)

Offset voltages $V_{OFF1}$ and $V_{OFF2}$ are generated by amplifers A11 and A10, respectively as referred to the amplifier inputs. Since feedback is provided from the output of amplifier A11 to the input of amplifier A10, $V_{OUT}=RI_O-$ (signal)+ $[0.5V_{OFF2}+1.5V_{OFF1}]$ (offset and noise). Therefore, the gain of inverting input of low-pass filter LPF1 is set to three times the gain at the non-inverting input, since the impact of offset/noise voltage $V_{OFF1}$ is three times that of offset/noise voltage $V_{OFF2}$ without gain compensation at the inputs of low-pass filter LPF1. The resultant operation generally increases the offset/noise voltage at the output of amplifier A11, which is not used as an output of output stage 16F, in order to cancel offset/noise generated by amplifier A10.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A digital-to-analog converter, comprising:
   a digital input for receiving a digital representation for conversion to an analog output signal;
   a shift-register having a plurality of outputs grouped into a first set of outputs and a second set of outputs, wherein the first set of outputs and the second set of outputs are mutually-exclusive;
   a plurality of positive polarity current sources, each including a switching element controlled by a corresponding one of the first set of outputs of the shift-register;
   a plurality of negative polarity current sources, each including a switching element controlled by a corresponding one of the second set of outputs of the shift-register; and
   a combining circuit for combining outputs of the positive polarity current sources and outputs of the negative polarity current sources to provide the analog output signal filtered by a filter response resulting from operation of the shift register, the positive polarity current sources and the negative polarity current sources.

2. The digital-to-analog converter of claim 1, wherein the plurality of positive polarity current sources and the plurality of negative current sources have the same quantity of current sources.

3. The digital-to-analog converter of claim 2, wherein half of a given one of the first set of outputs of the shift register or the second set of outputs of the shift register precede another one of the first set of outputs of the shift register or the second set of outputs of the shift register, and wherein the other half of the given set of outputs of the shift register follow the other set of outputs of the shift register.

4. The digital-to-analog converter of claim 1, wherein the plurality of positive polarity current sources includes a first switching circuit that applies the outputs of the positive polarity current sources to a first circuit node if the corresponding output of the shift register is asserted or a second circuit node if the corresponding output of the shift register is de-asserted, and wherein the plurality of negative current sources includes a second switching circuit that applies the outputs of the negative polarity current sources to the second circuit node if the corresponding output of the shift register is asserted or a first circuit node if the corresponding output of the shift register is de-asserted.

5. The digital-to-analog converter of claim 4, wherein the combining circuit is an amplifier having a differential input, wherein the first circuit node is coupled to a first input of the amplifier, and wherein the second circuit node is coupled to a second input of the amplifier.

6. The digital-to-analog converter of claim 5, wherein the amplifier has a differential output.

7. The digital-to-analog converter of claim 4, wherein the combining circuit comprises:
   a first amplifier having an input for receiving an output of the first circuit node; and
   a second amplifier having an input for receiving an output of the second circuit node, wherein the first amplifier provides either a single-ended output of the digital-to-analog converter or a non-inverted signal of a differential pair of outputs of the digital-to-analog converter, and wherein the second amplifier provides an inverted differential output of the digital-to-analog converter.

8. The digital-to-analog converter of claim 7, further comprising a feedback path coupled from an output of the second amplifier to the input of the first amplifier.

9. The digital-to-analog converter of claim 8, further comprising a switching circuit for selectively enabling the feedback path according to a mode select signal, wherein in a first mode, the switching circuit disables the feedback path to provide improved performance when using the single-ended output of the digital-to-analog converter, and wherein in a second mode, the switching circuit enables the feedback path to provide improved performance when using the differential output of the digital-to-analog converter.

10. A method of generating an analog output signal from a digital representation, comprising:
receiving the digital representation as a digital input value;
shifting the digital representation through a shift register having a plurality of outputs grouped into a first set of outputs and a second set of outputs, wherein the first set of outputs and the second set of outputs are mutually-exclusive;
first selecting a first group of positive polarity current sources in response to the first set of outputs of the shift register;
second selecting a second group of negative polarity current sources in response to the second set of outputs of the shift register;
first combining a first resultant current from the first group of positive polarity current sources and of the second group of negative polarity current sources to generate the analog output signal;
second combining a second resultant current from the positive current sources not selected by the first selecting and the negative current sources not selected by the second selecting;
third combining the first resultant current and the second resultant current to generate the analog output signal; and
repeating the shifting, the first selecting, and the second selecting to generate a filter response.

11. The method of claim 10, wherein the plurality of positive polarity current sources and the plurality of negative current sources have the same quantity of current sources.

12. The method of claim 11, wherein half of a given one of the first set of outputs of the shift register or the second set of outputs of the shift register precedes another one of the first set of outputs of the shift register or the second set of outputs of the shift register, and wherein the other half of the given set of outputs of the shift register follow the other set of outputs of the shift register.

13. The method of claim 10, wherein the first selecting and the second selecting are performed by switching circuits that couple each current source to a first circuit node or a second circuit node in response to a state of the corresponding shift register output.

14. The method of claim 13, wherein the third combining is performed by an amplifier having a differential input, wherein the first circuit node is coupled to a first input of the amplifier, and wherein the second circuit node is coupled to a second input of the amplifier.

15. The method of claim 14, wherein the amplifier has a differential output, and wherein the result of the third combining is a differential output pair of signals.

16. The method of claim 13, wherein the third combining is performed by a first amplifier and a second amplifier, wherein the first amplifier receives a result of the first combining, wherein the second amplifier receives a result of the second combining.

17. The method of claim 16, further comprising providing feedback from an output of the second amplifier to an input of the first amplifier.

18. The method of claim 17, further comprising:
receiving a mode select signal;
responsive to the mode select signal being in a first state, disabling the feedback; and
responsive to the mode select signal being in a second state, enabling the feedback.

19. A digital-to-analog converter integrated circuit, comprising:
at least one digital input terminal for receiving a digital representation for conversion to a first analog signal and a second analog signal;
a pair of output terminals for providing the first analog output signal and the second analog output signal;
a mode select circuit for selecting between a differential output mode and a single-ended output mode of the digital-to-analog converter integrated circuit;
a shift-register having a plurality of outputs grouped into a first set of outputs and a second set of outputs, wherein the first set of outputs and the second set of outputs are mutually-exclusive;
a plurality of positive polarity current sources, each including a switching element controlled by a corresponding one of the first set of outputs of the shift-register;
a plurality of negative polarity current sources, each including a switching element controlled by a corresponding one of the second set of outputs of the shift-register; and
a combining circuit for combining outputs of the positive polarity current sources and outputs of the negative polarity current sources to provide the first analog output signal and the second analog output signal, and coupled to the mode select circuit, wherein a single-ended or differential configuration of the combining circuit is selected in conformity with a state of the mode select circuit.

20. The digital-to analog converter integrated circuit of claim 19, wherein the combining circuit comprises:
a first amplifier having an input for receiving an output of the first circuit node;
a second amplifier having an input for receiving an output of the second circuit node, wherein the first amplifier provides either a single-ended output of the digital-to-analog converter or a non-inverted signal of a differential output of the digital-to-analog converter, and wherein the second amplifier provides an inverted differential output of the digital-to-analog converter;
a feedback path coupled from an output of the second amplifier to the input of the first amplifier; and
a switching circuit for selectively enabling the feedback path according to a mode select signal, wherein in a first mode, the switching circuit disables the feedback path to provide improved performance when using the single-ended output of the digital-to-analog converter, and wherein in a second mode, the switching circuit enables the feedback path to provide improved performance when using the differential output of the digital-to-analog converter.

* * * * *